(12) United States Patent
Tagami et al.

(10) Patent No.: US 6,710,330 B1
(45) Date of Patent: Mar. 23, 2004

(54) LIGHT-RECEIVING ELEMENT ARRAY DEVICE AND OPTICAL DEMULTIPLEXER USING THE SAME

(75) Inventors: Takashi Tagami, Osaka (JP); Kenichi Nakama, Osaka (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 353 days.

(21) Appl. No.: 09/744,541

(22) PCT Filed: Jun. 1, 2000

(86) PCT No.: PCT/JP00/03542

§ 371 (c)(1),
(2), (4) Date: Jan. 25, 2001

(87) PCT Pub. No.: WO00/76000

PCT Pub. Date: Dec. 14, 2000

(30) Foreign Application Priority Data

Jun. 4, 1999 (JP) ............................................. 11-157620

(51) Int. Cl.[7] ............................ H01J 3/14; H01J 40/14; H01J 5/16
(52) U.S. Cl. ......................... 250/234; 385/37; 359/130; 356/326
(58) Field of Search ................................. 250/226, 216, 250/239, 551, 234, 551.34, 237 A, 237 R, 227.18, 227.23, 208.1; 257/53, 678–733, 459, 433, 692, 693; 359/124, 130, 131, 127, 115, 187, 189; 385/15, 22, 24, 17, 34, 37, 92; 356/326

(56) References Cited

U.S. PATENT DOCUMENTS

| | | | |
|---|---|---|---|
| 5,555,334 A | * | 9/1996 | Ohnishi et al. ............... 385/93 |
| 5,926,272 A | * | 7/1999 | Curtiss et al. | 
| 6,256,436 B1 | * | 7/2001 | Nakama ....................... 385/37 |
| 6,360,041 B1 | * | 3/2002 | Nakama ....................... 385/37 |
| 6,373,606 B1 | * | 4/2002 | Nakama ..................... 359/130 |

FOREIGN PATENT DOCUMENTS

| | | |
|---|---|---|
| JP | 57-29005 | 2/1982 |
| JP | 133579/1986 | 3/1988 |
| JP | 1-142506 | 6/1989 |
| JP | 1-184865 | 7/1989 |
| JP | 5-343563 | 12/1993 |
| JP | 8-75544 | 3/1996 |

\* cited by examiner

*Primary Examiner*—Frank G. Font
*Assistant Examiner*—Willie Davis
(74) *Attorney, Agent, or Firm*—RatnerPrestia (57) ABSTRACT

In the light-receiving element array device according to the present invention, a light-receiving section can be arranged at a position close to an input optical fiber so that the light-receiving element array device can be used as an optical demultiplexer based on the Littrow arrangement. Further the present invention enables suppression of coma aberration and minimization of an optical demultiplexer by shortening a length of the optical system. To achieve the above-described object, a rectangular chip having a light-receiving section with a number of light-receiving elements arrayed in row thereon is sealed in a rectangular package having external leads and the bonding pads on the chip and the bonding terminals of the packages are connected with a bonding wire or the like. This light-receiving element array device has any of the following constructions: (1) in which no bonding pad is provided along one longer edge of the chip in an area around a light-receiving section of the chip, (2) in which no bonding terminal is provided along one longer edge of the package, or (3) in which no external lead is provided along one longer edge of the package, or a combination of the constructions, and the chip is accommodated in the package at a position displaced to one side of the package.

14 Claims, 8 Drawing Sheets

LIGHT-RECEIVING ELEMENT ARRAY DEVICE AND OPTICAL DEMULTIPLEXER USING THE SAME

TECHNICAL FIELD

The present invention relates to a light-receiving element array device comprising a rectangular light-receiving element array chip incorporated in a package, and more specifically to a light-receiving element array device in which a distance from a center of a light-receiving section of the light-receiving element array chip to a longer edge of the rectangular package is small. Further this invention relates to an optical demultiplexer using the light-receiving element array device as described above.

BACKGROUND ART

The optical demultiplexer is used, for instance, in the photoelectric communications based on the wavelength multiplexed transmission system as a device for separating light transferred to the receiving side in the multiplexed form to several light components each corresponding to a wavelength. Optical demultiplexers having various configurations have been developed, and one of the representative optical demultiplexers uses therein a diffraction grating as an optical demultiplexing element.

One of the optical demultiplexers using a diffraction filter therein has the configuration generally called as "Littrow type arrangement". This type of optical demultiplexer comprises an input optical fiber, a collimator lens, and a diffraction grating, and in this optical demultiplexer, an optical signal from the input optical fiber is collimated by the collimator lens and is guided to the diffraction grating, and the diffracted light is again converged by the collimator lens for the light to be detected. For detection of the light, the diffracted light is guided to a light detector using a number of optical fibers or a light guide path array.

As another type of optical demultiplexer using a diffraction grating therein, there is the one comprising an input optical fiber, a collimator lens, a reflection mirror, and a diffraction grating, and in this type of optical demultiplexer, an optical signal from the input optical fiber is collimated by the collimator lens, reflected by the reflection mirror, and guided to the diffraction grating, and then the diffracted light is guided to the light detector.

The light-receiving element array device is used as a light detector for the optical demultiplexer as described above. The light-receiving element array device has the configuration in which a rectangular chip having a light-receiving section with a number of light-receiving elements arranged in the array form thereon is packaged at a center of a rectangular DIP type of package having a number of external leads and further bonding pads for the chip and bonding terminals each at an inner edge of the corresponding external lead are connected to each other with a bonding wire. The external leads are led out from both edges of the package. All of the light-receiving element array devices commercially available at present in the market use the DIP type of package as described above.

Of the optical demultiplexers as described above, in the latter type of optical demultiplexer using a reflection mirror therein, an optical axis of the light branched by the diffraction grating is substantially vertical to an optical axis of the light induced onto the reflection mirror, so that substantial size reduction is difficult.

In contrast, in the former optical demultiplexer based on the "Littrow type arrangement", an optical axis of the light passing through the collimator lens and induced onto the diffraction grating is substantially identical to that of the diffracted light passing through and coming out from the collimator lens, so that the substantial size reduction is possible.

When the light-receiving element array device having the conventional configuration is used as a light detector, however, as the light-receiving section can not be arranged at a position adjacent to an input optical fiber, coma aberration of the collimator lens increases, which results in degradation of the optical characteristics of the light-receiving element array device. Namely the distance from the light-receiving section of the light-receiving element array chip to a longer edge of the package is large, and the distance between the light-receiving section and the input optical fiber can not be shortened due to the package's size, although it is necessary to arrange an input optical fiber and a light-receiving section at conjugate positions. Therefore a length of the optical system corresponding to the distance between the input optical fiber and the light-receiving section is required, which is a large obstacle in size reduction of an optical demultiplexer.

DISCLOSURE OF THE INVENTION

It is an object of the present invention to provide a light-receiving element array device having the construction in which the distance between a longer edge of a rectangular package and a center of a light-receiving section of a light-receiving element array chip is small.

It is another object of the present invention to provide a light-receiving element array device well adapted to use as an optical demultiplexer based on the Littrow type of arrangement in which the light-receiving section can be arranged at a position adjacent to the input optical fiber.

It is still another object of the present invention to provide an optical demultiplexer based on the Littrow type of arrangement which enables suppression of coma aberration and reduction of the optical system length even when a light-receiving element array device is used therein as a light detector.

The light-receiving element array device according to the present invention is based on the configuration in which a light-receiving element array chip having a light-receiving section with a number of light-receiving elements arranged thereon in the array form is sealed in a rectangular package having a number of external leads and bonding terminals connected to the external leads respectively and each of the bonding terminals of the package is connected to a bonding pad on the chip with a bonding wire or the like. The light-receiving element array device according to the present invention may be based on any of the following constructions:

(1) in which no bonding pad is provided in the side along one longer edge of the light-receiving element array chip and the chip is accommodated in the package at a position displaced to one side thereof so that the longer edge of the chip, along which no bonding pad is provided, is close to one longer edge of the package, (2) in which no bonding terminal is provided in the side along one longer edge of the package and the chip is accommodated in the package at a position displaced to one side thereof so that a longer edge of the chip is close to the longer edge of the package along which no bonding terminal is provided, or (3) in which no external lead is provided along one longer edge of the package and the chip is accommodated in the package at a position displaced to one side thereof so that a longer edge of the chip is close to the longer edge of the package along which no bonding terminal is provided, or on a combination of the constructions. More specifically it is preferable that the distance between a center of the light-receiving section of the chip and a longer edge of the package is 3 mm or less when any of the constructions described above is employed.

The optical demultiplexer according to the present invention is based on the configuration in which an input optical fiber, a collimator lens, and a light-receiving element array are arranged according to the Littrow type arrangement. With this arrangement, the condition of W/L≦4/50 must be satisfied, wherein L (mm) indicates the distance from a main surface position of the collimator lens to the light-receiving section of the light-receiving element array and W (mm) indicates the distance from a center of the light-receiving section of the chip to a center of the input optical fiber. To satisfy this condition, the light-receiving element array device in which the chip is accommodated in the package at a position displaced to one side thereof as described above is used, and the light-receiving element array device is arranged so that the light-receiving section is close to and faces the input optical fiber mounting section.

BEST MODE FOR CARRYING OUT THE INVENTION

Figure 1:
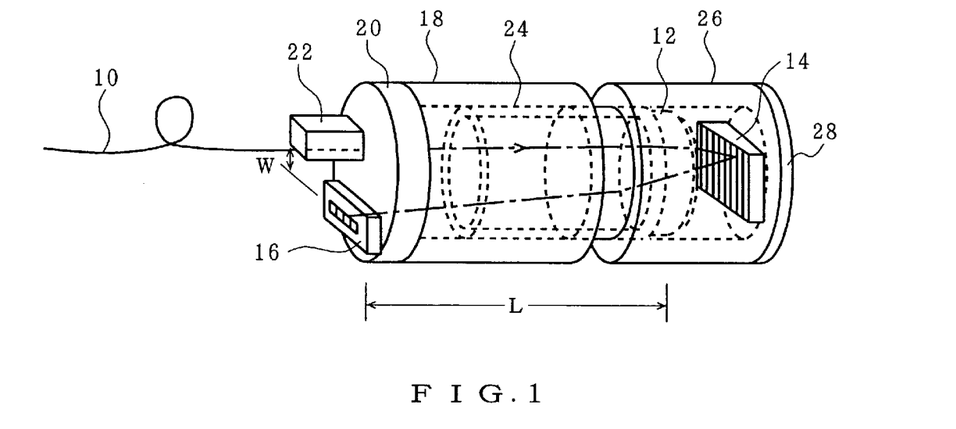
FIG. 1 is a view showing an optical demultiplexer based on the Littrow type arrangement.

At first, an example of the optical demultiplexer according to the present invention is described with reference to FIG. 1. This optical demultiplexer comprises an input optical fiber 10, a collimator lens 12, a diffraction grating 14, and a light-receiving element array device 16 which functions as a light detector, and the components are assembled using three tube members. The single core input optical fiber 10 is fixed with a fiber joint section 22 to a fiber setting window 20 provided on an edge face of a tube 18 for accommodating a transparent fiber therein. The collimator lens 12 is fixed to an edge section of an intermediate tube 24. Further the diffraction grating 14 is fixed to a diffraction grating setting window 28 provided on an edge face of a tube 26 for accommodating a diffraction grating therein. In this example, the tube 18 for accommodating an optical fiber therein and the tube 26 for accommodating a diffraction grating tube are externally attached to two edge sections of the intermediate tube 24, and the two tubes 18 and 26 can be moved along and at the same time rotated around the optical axis for allowing active alignment.

A light flux introduced from the external input optical fiber 10 into the tube 18 and diverged according to a numerical aperture of the input optical fiber 10 reaches the collimator 12 and is converted to a parallel light flux, and then reaches the diffraction grating 14. The light flux separated to light components each corresponding to a wavelength according to the wavelength divergence characteristics of the diffraction grating 14 is converted by the collimator lens 12 to a converged light flux by each light component corresponding to a wavelength, and the converged light fluxes each corresponding to a wavelength are focused as arrayed points on the window 20 at a focal point of the collimator lens 12. Light components each corresponding to a wavelength are detected by fixing the light-receiving element array device 16 on the window 20 so that the focusing points for the light components each corresponding to a wavelength correspond to light-receiving elements on the light-receiving element array device 16 respectively.

By the way, the diffracted light fluxes pass through the collimator 12 in a direction inclined to the optical axis, so that coma aberration is generated. The coma aberration of the collimator 12 relates to the length L from a main surface position of the collimator lens 12 to a light-receiving section of the light-receiving element array device 16 as well as to the distance W from a center of the light-receiving section of the light-receiving element array device 16 to a center of the input optical fiber 10. To reduce the coma aberration, it is necessary to make the W/L ratio smaller.

Figure 2A:
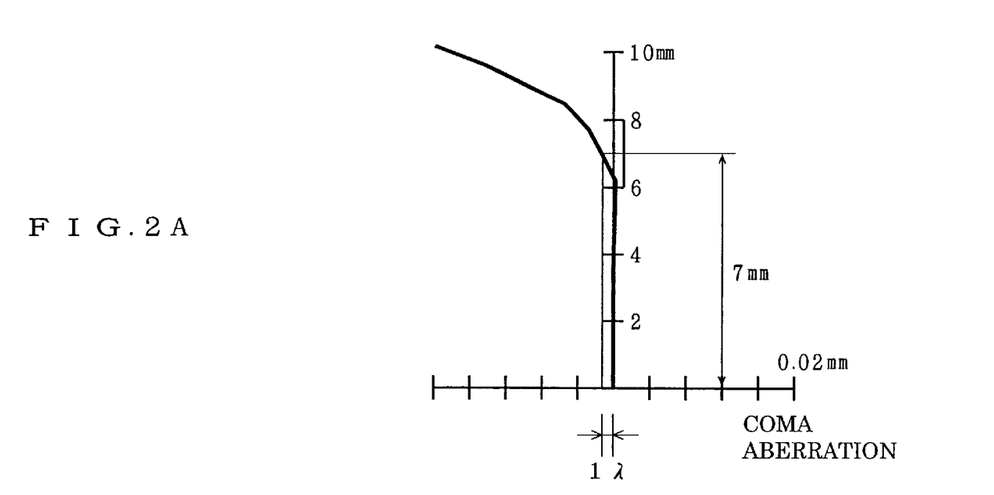
FIG. 2A and FIG. 2B are views each illustrating coma aberration of a collimator lens incorporated in an optical demultiplexer.

FIG. 2A shows a result of simulation for coma aberration when a collimator lens with the diameter of 20 mm and focal distance of 50 mm is used. The vertical axis indicates a radius of the lens, while the horizontal axis indicates a degree of coma aberration. In the case of a light flux having the wavelength λ in a range from 1500 to 1600 nm, a collimator lens with the diameter of 14 mm or less can be used with the coma aberration suppressed to 1λ or less. The light flux diameter on the pupil surface is around 10 mm assuming the attenuation of $1/e^2$.

Figure 2B:
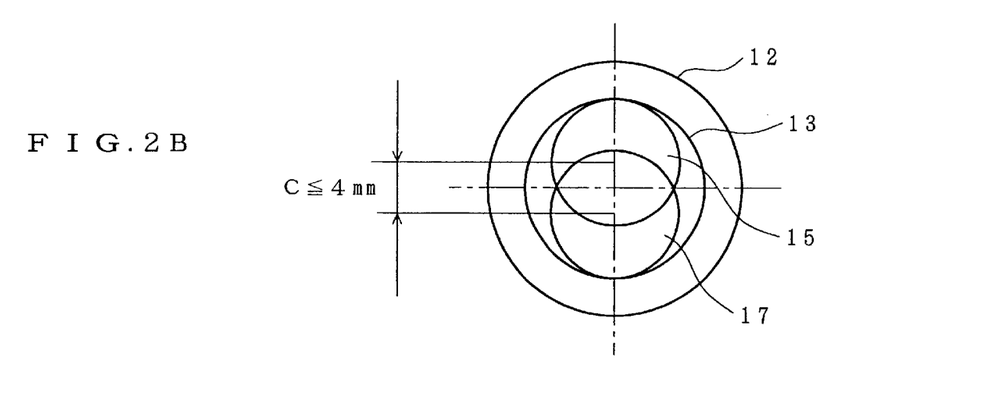

FIG. 2B shows a cross section of the collimator lens 12. As shown in FIG. 2B, a forward light flux (with the diameter of 10 mm on the pupil surface) from the input optical fiber 10 to the diffraction grating 14 and the return light flux (with the diameter of 10 mm on the pupil surface) from the diffraction grating 14 to the light-receiving element array device 16 enter an area with the diameter of 14 mm and with the coma aberration of 1λ or less only when the distance C between centers of the two components is not more than 4 mm. Namely it is required that the distance W between a center of the input optical fiber and that of the light-receiving section is within 4 mm.

As shown in FIG. 2A, the coma aberration is within 0.5λ in the area with the diameter of 12 mm or less, so that a further remarkable effect can be achieved when the distance W between a center of the input fiber 10 and that of the light-receiving element array device 16 is 3 mm or less. Therefore coma aberration of a collimator can be suppressed in a range where the condition of W/L≦4/50 is satisfied, and more preferably the condition of W/L≦3/50 should be satisfied. Therefore, in the case of the optical demultiplexer shown in FIG. 1, the distance W should be set to 4 mm or less, when the distance L is 50 mm, to prevent generation of coma aberration of the collimator lens. When the distance W is 3 mm or less, the effect of suppressing the coma aberration becomes more remarkable.

For the reasons as described above, to make smaller a value of the distance W between a center of the input optical fiber 10 and that of a light-receiving section of the light-receiving element array device 16, the present inventors paid attention to the light-receiving element array chip and a package for it, and succeeded in shortening the distance from a light-receiving section of the light-receiving element array device to a longer edge of the package.

Figure 3:
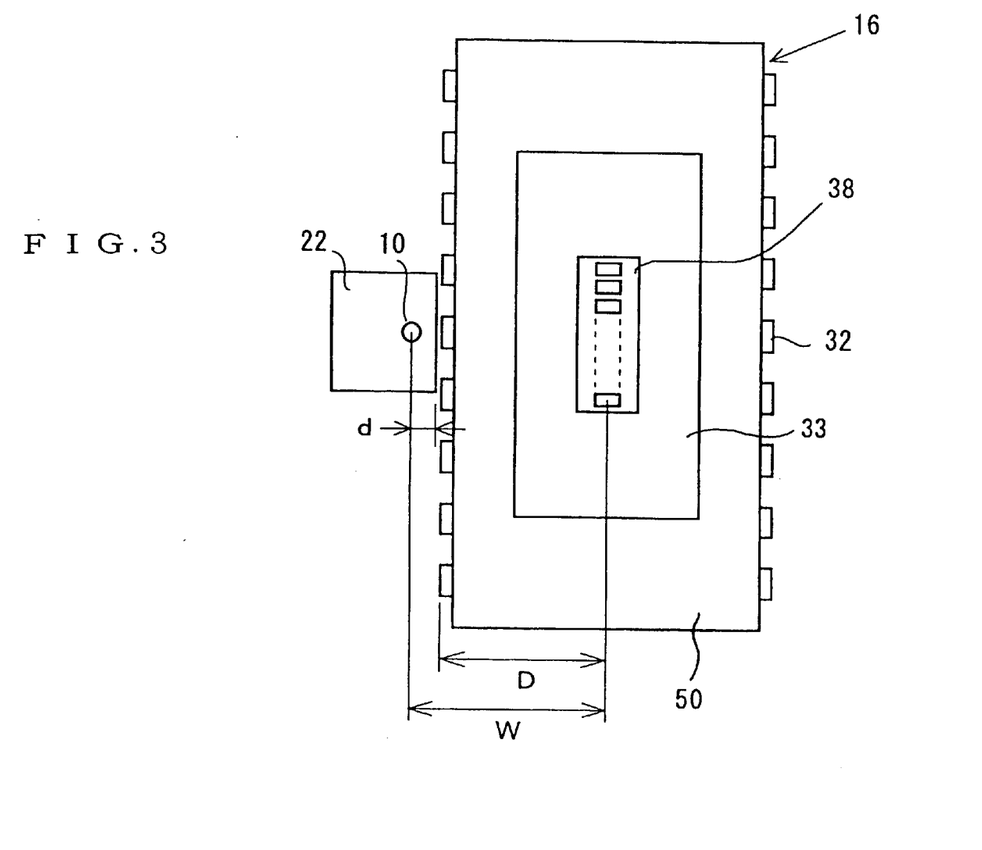
FIG. 3 is a plan view showing a conventional type of light-receiving element array device.

FIG. 3 is an explanatory view for the distance W from a center of the input optical fiber 10 to a center of the light-receiving element array device 16. Assuming that the sign d indicates a distance from a center of the input optical fiber 10 to an edge section of the fiber joint section 22 and the sign D indicates a distance from a center of the light-receiving section of the light-receiving element array device 16 to a longer edge of a package 50 (in this case, an edge of the external lead 32), when the fiber joint section 22 is close to the package 50, W is equal to a sum of D and d (W=D+d), but sometimes a clearance may be provided between the fiber joint section and the package, so that the condition of W≧D+d is satisfied. To insure high resistance of the input optical fiber 10 against sever environmental conditions, the distance d from a center of the input optical fiber 10 to an edge of the fiber joint section 22 is required to be at least 1 mm, so that the distance D from a center of the light-receiving section of the light-receiving element array device 16 to a longer edge of the package 50 should preferably be not more than 3 mm.

Figure 4:
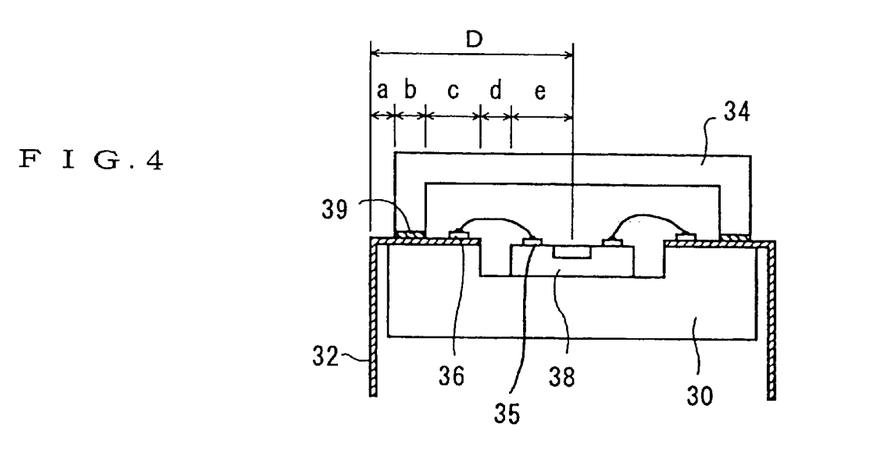
FIG. 4 is a cross-sectional view showing the light-receiving element array device shown in FIG. 3.

FIG. 4 shows a cross section of the light-receiving element array device 16 show in FIG. 3. Mounted in a recessed section 33 of a package body 30 with external leads 32 provided along longer edges in both sides thereof is a light-receiving element array chip 38, and a bonding pad 35 on the chip 38 and a wire bonding terminal (an inner edge of the external lead) 36 of the package 50 is bonded with a wire, and then a sealing cap 34 is bonded with a sealing member 39 to the package body 30.

In this figure, the sign a indicates the distance between an external side face of the external lead 32 and an external side face of the sealing cap 34. The sign b indicates the thickness of the side wall of the sealing cap 34. The sign c indicates the an internal side face of the recessed section 33. The sign e indicates the distance from a center of the light-receiving section of the light-receiving element array chip 38 to a longer edge of the chip. The distance D is a sum of a, b, c and d. When difference and displacement of the external lead 32 of the package 50 and the sealing member 39 from their respective regular size and position are taken into considerations, the distance a is required to be in a range from 0.1 to about 1 mm. The distance b is about 1 mm, the distance c is a distance required for attachment of the wire bonding terminal 36 and is about 0.5 mm, and the distance d is required to be about 0.5 mm. Therefore a sum of the distances a, b, c, and d is required to be in the range from 2.5 to 3.0 mm. Further, when the bonding pad 35 on the light-receiving element array chip 38 and wiring (not shown) from the wire bonding pad 35 to the light-receiving element are taken into considerations, the distance e is required to be about 0.5 mm. Therefore the total distance D from a longer edge of the package 50 to a center of the light-receiving section of the light-receiving element array chip 38 is 3.0 mm or more.

To realize a light-receiving element array device best suited to an optical demultiplexer which can suppress coma aberration by reducing the distance D from a center of a light-receiving section of the light-receiving element array chip 38 to a longer edge of the package 50 to 3 mm or less, the present invention employs any of the following constructions; invention employs any of the following constructions;

(1) in which no bonding pad is provided in a section of the light-receiving element array chip along a longer edge thereof, (2) in which no bonding terminal is provided in a section of the package along a longer edge thereof, or (3) in which no external lead is provided in a section of the package along a longer edge thereof, of a combination of the constructions (1) to (3), so that the light-receiving chip is accommodated in the package at a position displaced to the longer edge thereof.

Figure 5A:
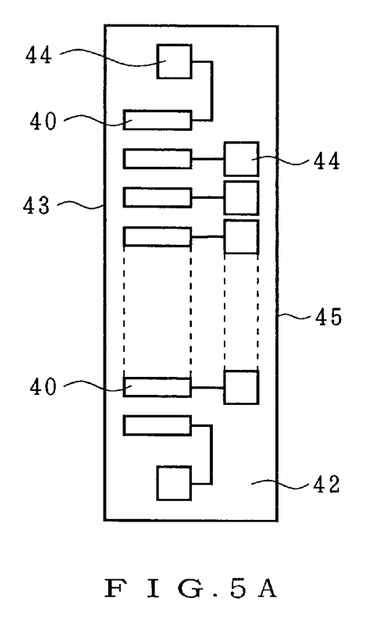
FIG. 5A and FIG. 5B are plan views each showing a light-receiving element array chip according to the present invention.
Figure 5B:
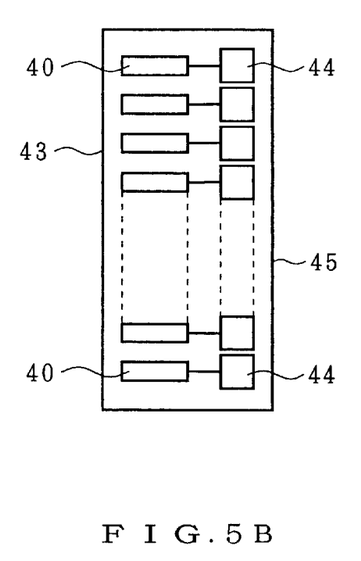

FIG. 5A and FIG. 5B are views each showing an example of a chip incorporated in the light-receiving element array device according to the present invention. FIG. 5A shows an example in which bonding pads 44 each for extracting an electric signal from a light-receiving element 40 on a light-receiving element array chip 42 with a number of light-receiving elements 40 provided thereon are not provided along a longer edge 43 of the package facing the input optical fiber 10. The bonding pads 44 for the light-receiving elements 40 at both edges of the array are arranged in the same array direction as the light-receiving elements 40, and other bonding pads 44 are arranged in a row along a longer edge 45 opposite to-the longer edge 43. FIG. 5B shows an example in which the bonding pads 44 are arranged in a row along the longer edge 45 opposite to the input optical fiber 10.

In either case, as no bonding pad 44 is provided along the 10 is connected, so that a light-emitting section consisting of light-receiving elements 40 can be arranged at a position close to the longer edge 43. Because of this configuration, the distance D from a center of the light-receiving section of the light-receiving element array chip 42 to a longer edge of the package 50 in the side of the input optical fiber 10 is connected can be shortened by about 0.2 to 0.3 mm, so that the distance can be reduced to 3 mm or less.

Figure 6A:
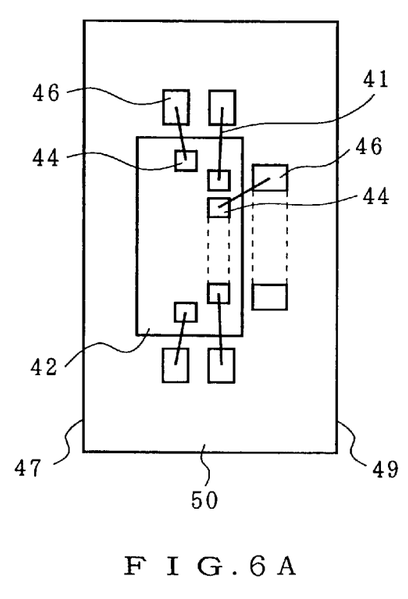
FIG. 6A and FIG. 6B are views each showing wire bonding terminals of a package according to the present invention.
Figure 6B:
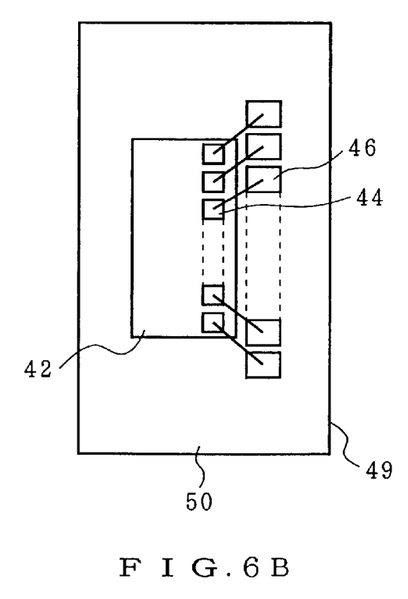

FIG. 6A and FIG. 6B are views each showing wire bonding terminals on the package 50 when the chip 42 shown in FIG. 5A or FIG. 5B is mounted thereon. For simplifying the figures, a light-receiving section of the light-receiving element array chip 42 is not shown in FIG. 6A and FIG. 6B.

The bonding pad 44 on the chip 42 and the bonding terminal 46 on the package 50 are connected to each other with a bonding wire 41 respectively. An electric signal generated in the light-receiving element array chip 42 is sent from the bonding pad 44 on the chip 42 via the bonding wire 41 to the bonding terminal 46 on the package 50 and is output from an external lead (not shown) on an external periphery of the package 50.

FIG. 6A shows an example in which the light-receiving element array chip 42 shown in FIG. 5A is incorporated therein and the bonding terminals on the package 50 are not provided along a longer edge 47 thereof to which the input optical fiber 10 is connected. In this example, the bonding terminals 50 are provided connected. In this example, the bonding terminals 50 are provided along shorter edges and one longer edge of the package 50.

FIG. 6B shows an example in which the light-receiving element array chip 42 shown in FIG. 5B is incorporated like in FIG. 6A and the bonding terminals 64 on the package 50 are not provided along the longer edge 47 of the package 50 in the side of the input optical fiber 10. In this example, the bonding terminals 46 are provided in a row only along the longer edge 49 of the package 50. Because the bonding terminals 46 on the package 50 are not provided in the side to the input optical fiber 10, the light-receiving element array chip 42 can be arranged at a position displaced toward the longer edge 47 of the package 47, so that the distance D from a center of the light-receiving section of the light-receiving element array chip device 42 to the longer edge 46 of the package 50 can further be shortened by around 0.5 mm.

Figure 7A:
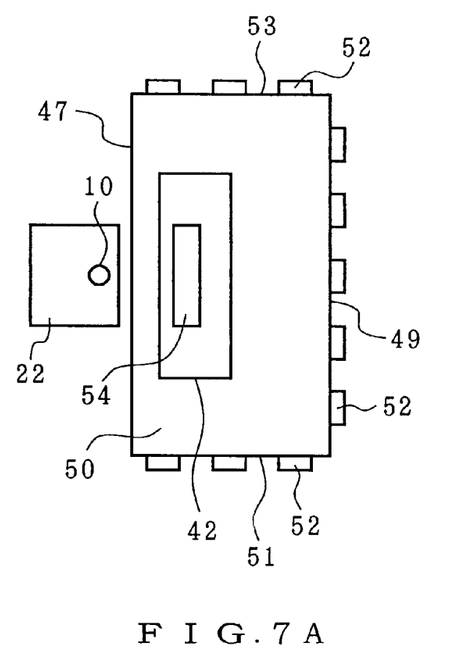
FIG. 7A, FIG. 7B, and FIG. 7C are views each showing external lead mounting positions of the package according to the present invention.
Figure 7B:
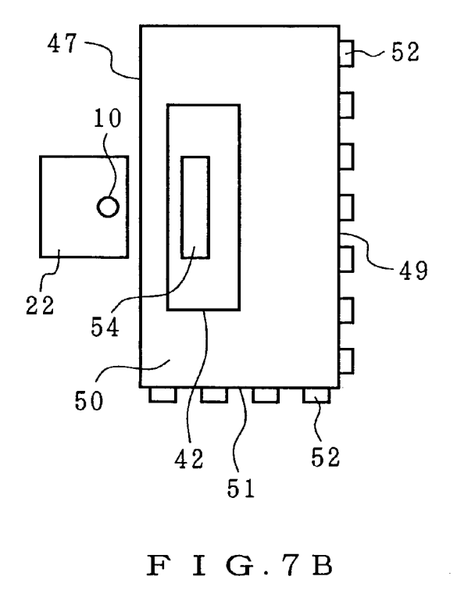
Figure 7C:
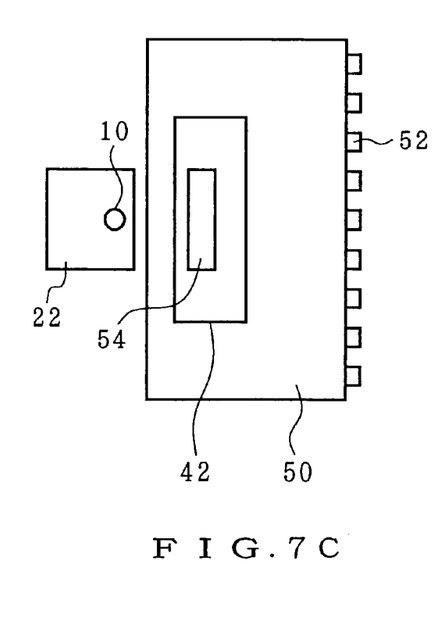

FIG. 7A, FIG. 7B, and FIG. 7C are views each showing examples of external led mounting positions on the package 50 respectively. FIG. 7A shows an example in which the external leads 52 for the package 50 are arranged two shorter edges 51, 53 and one longer edge 59 of the package 50 and are not provided in the side to the input optical fiber 10. FIG. 7B shows a case in which the external leads are arranged along one shorter edge 51 and one longer edge 49 of the package and are not provided along the longer edge 47. FIG. 7C shows a case in which the external leads 52 are provided optical fiber 10.

As described above, when the external leads 52 on the package 52 are not arranged along the longer edge 74, the package 50 can be arranged at a position closer to the joint section 22 for the input optical fiber 10, so that the distance D can be shorted by about 0.5 mm to 3 mm or less. Therefore the distance W from a center of a light-receiving section 54 of the light-receiving element array chip 42 to a center of the input optical fiber 10 can be made smaller.

Figure 8A:
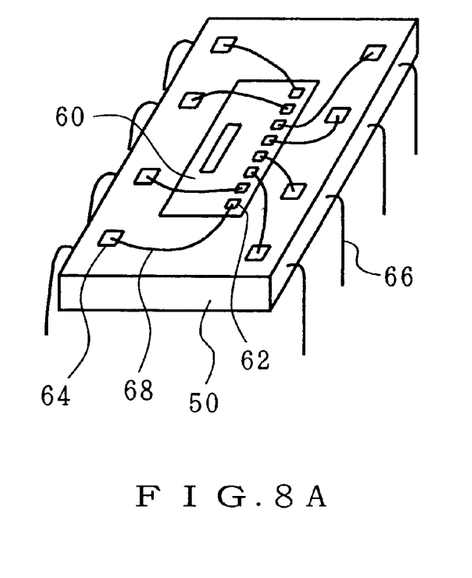
FIG. 8A, FIG. 8B, and FIG. 8C are perspective views showing embodiments of the light-receiving element array device according to the present invention respectively.
Figure 8B:
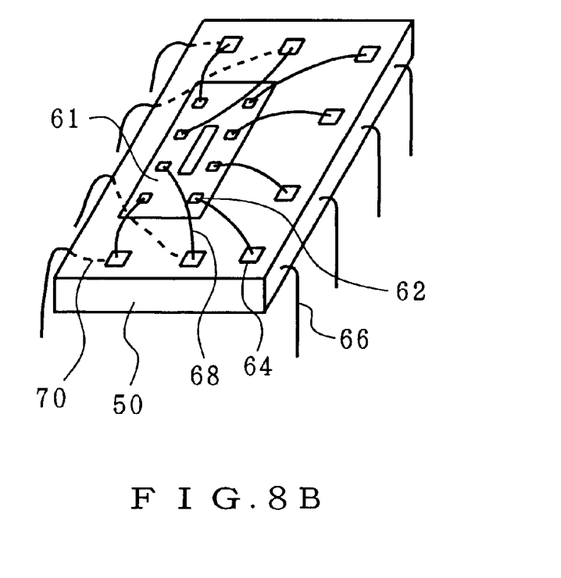
Figure 8C:
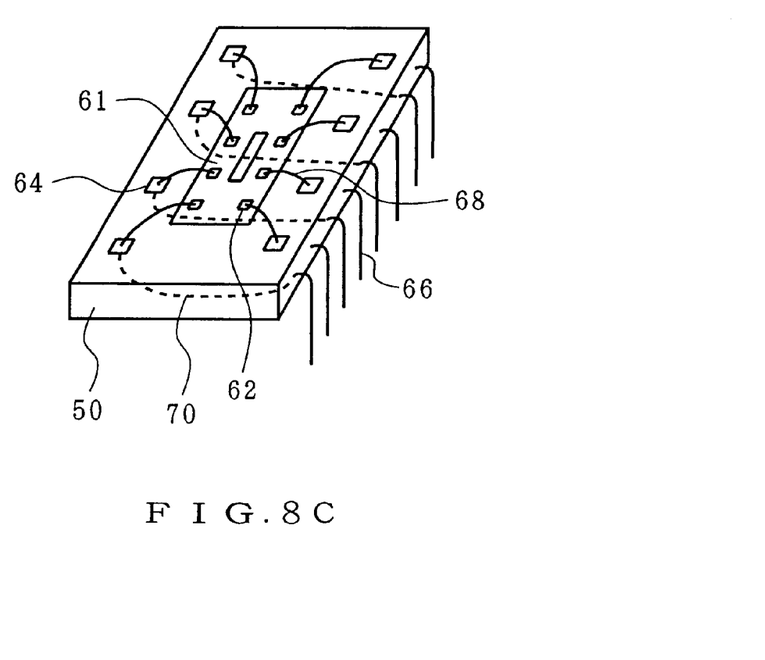
Figure 9A:
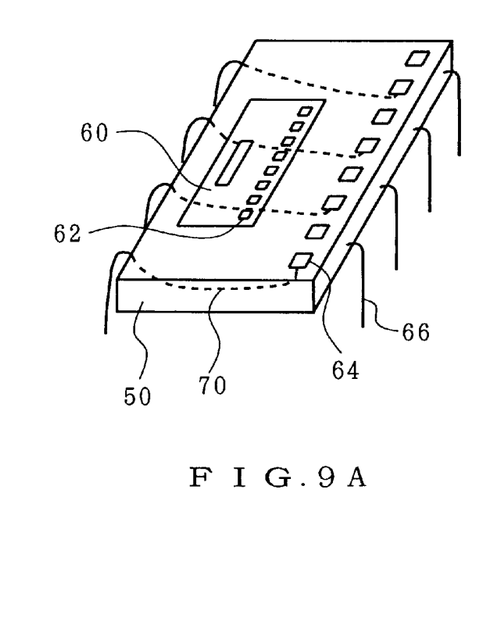
FIG. 9A, FIG. 9B, FIG. 9C and FIG. 10 are perspective views showing embodiments of the light-receiving element array device according to the present invention respectively.
Figure 9B:
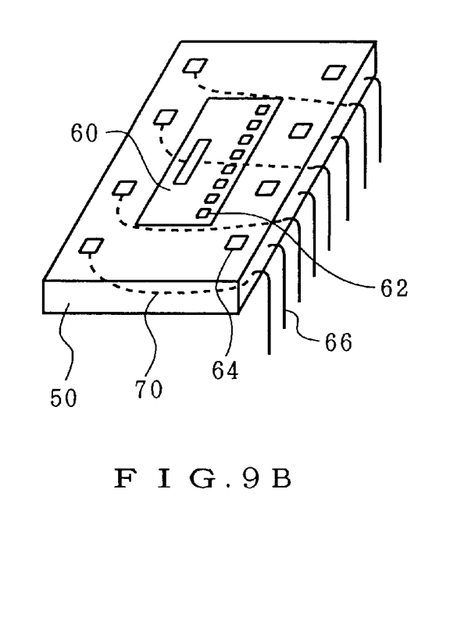
Figure 9C:
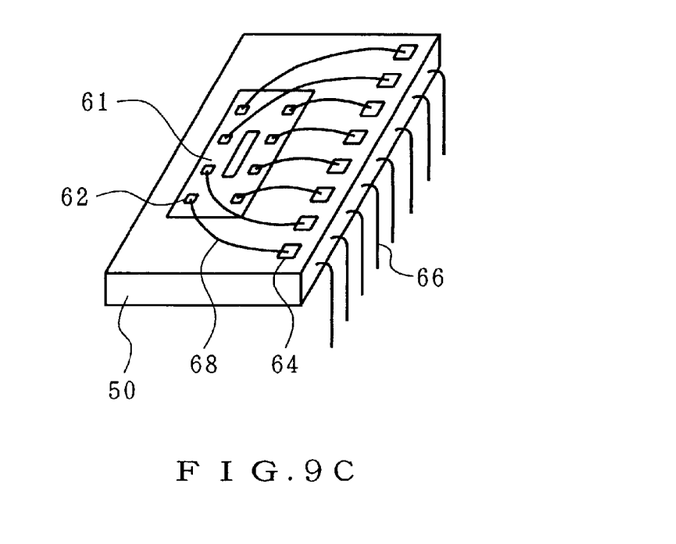
Figure 10:
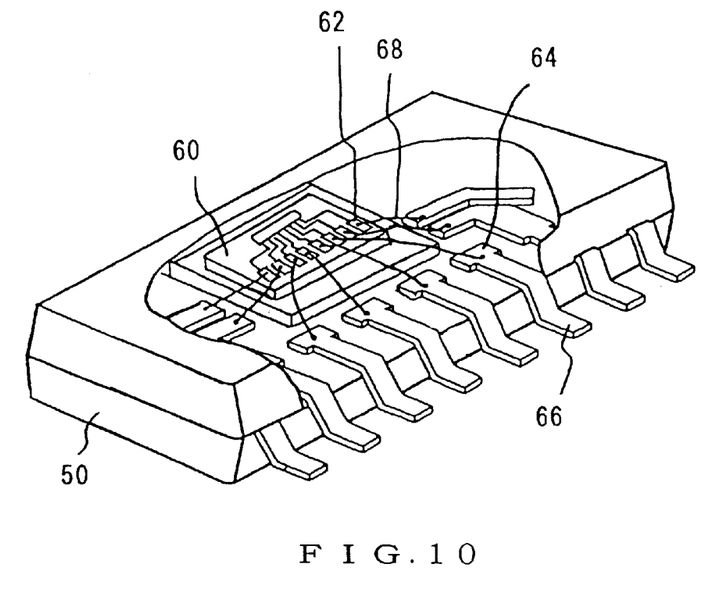

General configuration of the light-receiving element array device according to the present invention is shown in FIG. 8 to FIG. 10. As described above, to make smaller the distance between a center of a light-receiving section of a light-receiving element array chip and one longer edge of the package, the preset invention employs any of the following constructions, (1) in which no bonding is provided along one longer edge of the light-receiving element array chip,
(2) in which no bonding terminal is provided along one longer edge of the package, or
(3) in which no external lead is provided along one longer edge of the package, or a combination of the constructions (1) to (3) (namely, (1)+ (2), (1)+(3), (2)+(3), or (1)+(2)+(3)), and because of the configuration, the light-receiving section of the light-receiving element array chip can be accommodated in the package receiving element array chip can be accommodated in the package at a position displaced to one longer edge thereof.

FIG. 8A shows the construction corresponding to (1) above. A chip 60 has bonding pads 62 provided thereon only along one longer edge thereof. The package 50 has bonding terminals 64 and external leads 66 provided along both sides thereof. The bonding pad 62 and bonding terminal 64 are connected to each other with a bonding wire 68. It should be noted that, in this example, the bonding terminal 64 on the package 50 comprises an inner edge of the external lead 66.

FIG. 8B shows an example of construction corresponding to (2) above. A chip 61 has the bonding pads provided along both longer edges thereof. The package 50 has the bonding terminals 64 provided along three edges thereof, but the bonding terminals are not provided along one longer edge thereof. In this example, each of the bonding terminals 64 arranged in a row in the right side in this figure comprises an inner edge of the external leads to the right side from the bonding terminal 64, and other bonding terminals 64 are connected with the internal leads 70 (shown by the dotted lines) to the external leads 66 arranged to the left side from the corresponding bonding terminal 64. The internal lead 70 is described in detail hereinafter.

FIG. 8C shows the construction corresponding to (3) above. The chip 61 has the bonding pads 62 provided along both longer edges thereof. The package 50 has the bonding terminals 64 provided along both longer edges thereof, and also has external leads provided only along one of the longer edges thereof. In this figure, the bonding terminals in the left side are connected to the corresponding external leads 66 with the internal leads 70 (shown by the doted lines) respectively.

It is possible to further shorten the distance D between a center of the light-receiving section of the light-receiving element array chip and a longer edge of a package with the chip provided thereon by combining the constructions (1) to (3).

FIG. 9A shows the construction corresponding to a combination of (1) and (2) above. The chip 60 has the bonding pads 62 arrayed in a row only along one of the longer edges thereof, while the package 50 has the bonding terminals 64 arrayed in a row only one longer edge thereof, and also has the external leads 66 provided along the two edges thereof. In the figure, the external leads 66 in the left side are connected with the internal leads 60 to the corresponding to the bonding terminals 64 respectively.

FIG. 9B shows the construction corresponding to a combination of (1) and (3). The chip 60 has the bonding pads 62 arrayed in a row only along one of the longer edges thereof, while the package 50 has the bonding terminals 64 provided along both longer edges thereof and also has the external leads 66 provided only along one of the longer edges thereof. In the figure, the bonding terminals 64 in the left side are connected with the internal leads 70 (shown by the dotted lines) to the corresponding external leads 66 respectively.

FIG. 9C shows the construction corresponding to a combination of (2) and (3) above. The chip 61 has the bonding pads 62 provided along both longer edges thereof, while the package 50 has the bonding terminals 64 arranged in a row only along one of the longer edges thereof and also has the external leads 66 provided only along the same longer edge. The bonding terminals 62 on the chip 61 and the bonding terminals 64 on the package 50 are connected to each other with the bonding wires 68 respectively. For simplifying the illustrations, the bonding wires are not shown in FIG. 9A and FIG. 9B.

FIG. 10 is a partially lacked perspective view showing an example of the construction corresponding to a combination of (1), (2) and (3) above. The chip 60 has the bonding pads 62 provided only along one of longer edges thereof and also has the package 50 having the external leads 66 provided along the same longer edge accommodated thereof. An electric signal generated in a light-receiving element is sent from the bonding pad 62 on the chip 60 to the bonding terminal 64 (comprising an inner edge of the corresponding external lead) on the package 50, and is output to the outside from the external lead 66 on the package 50.

Figure 11:
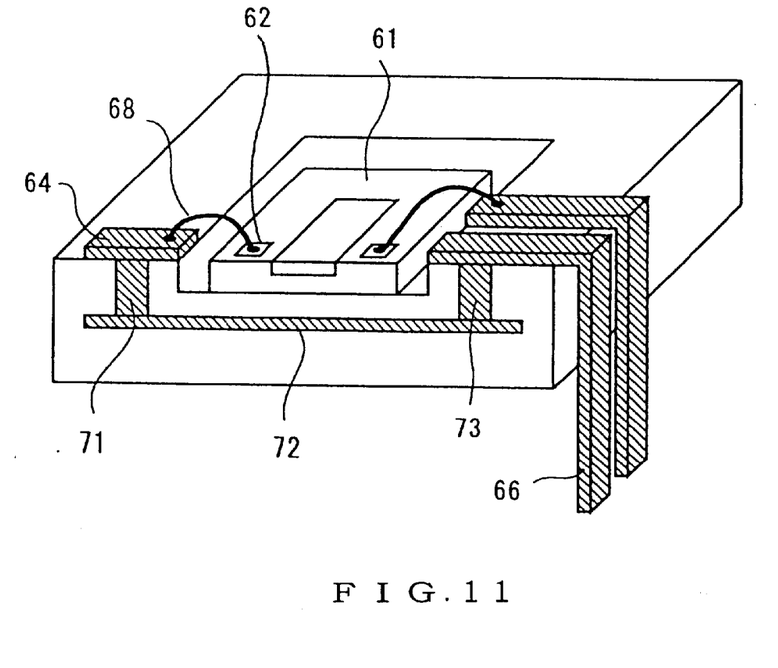
FIG. 11 is a perspective view showing a cross section of a package in the light-receiving element array device according to the present invention.

In the construction shown in FIG. 8A or in FIG. 9C, the bonding terminal on the package 50 may comprise an inner edge of the corresponding bonding terminal. In FIG. 8C, FIG. 9A or in FIG. 9B, however, some of the bonding terminals are connected with the internal leads 70 to the external leads 66 respectively. FIG. 11 shows the construction. In this figure, the bonding terminal 64 in the left side is connected via a throughhole 71, an internal lead 72, and a throughhole 73 to the external lead 66 in the right side. The bonding pad 62 on the chip 61 and the bonding terminal 64 are connected to each other with the bonding wire 68.

In each of the examples described above, a bonding pad on a chip and a bonding terminal on a package are connected to each other only with a bonding wire, and this connection may be carried out with a relay wire provided on the package. When the bonding wire crosses a light-receiving section on the chip, it is better to use the relay wire as described above. In this case, connection is made from a bonding pad with a bonding wire and also with a relay wire provided on the package and again with a bonding wire to a bonding terminal. For providing a relay wire on a package, the wire may previously be provided on the package like wiring on a printed board, or a mount plate with wiring provided thereon may be arranged adjacent to the chip.

Figure 12:
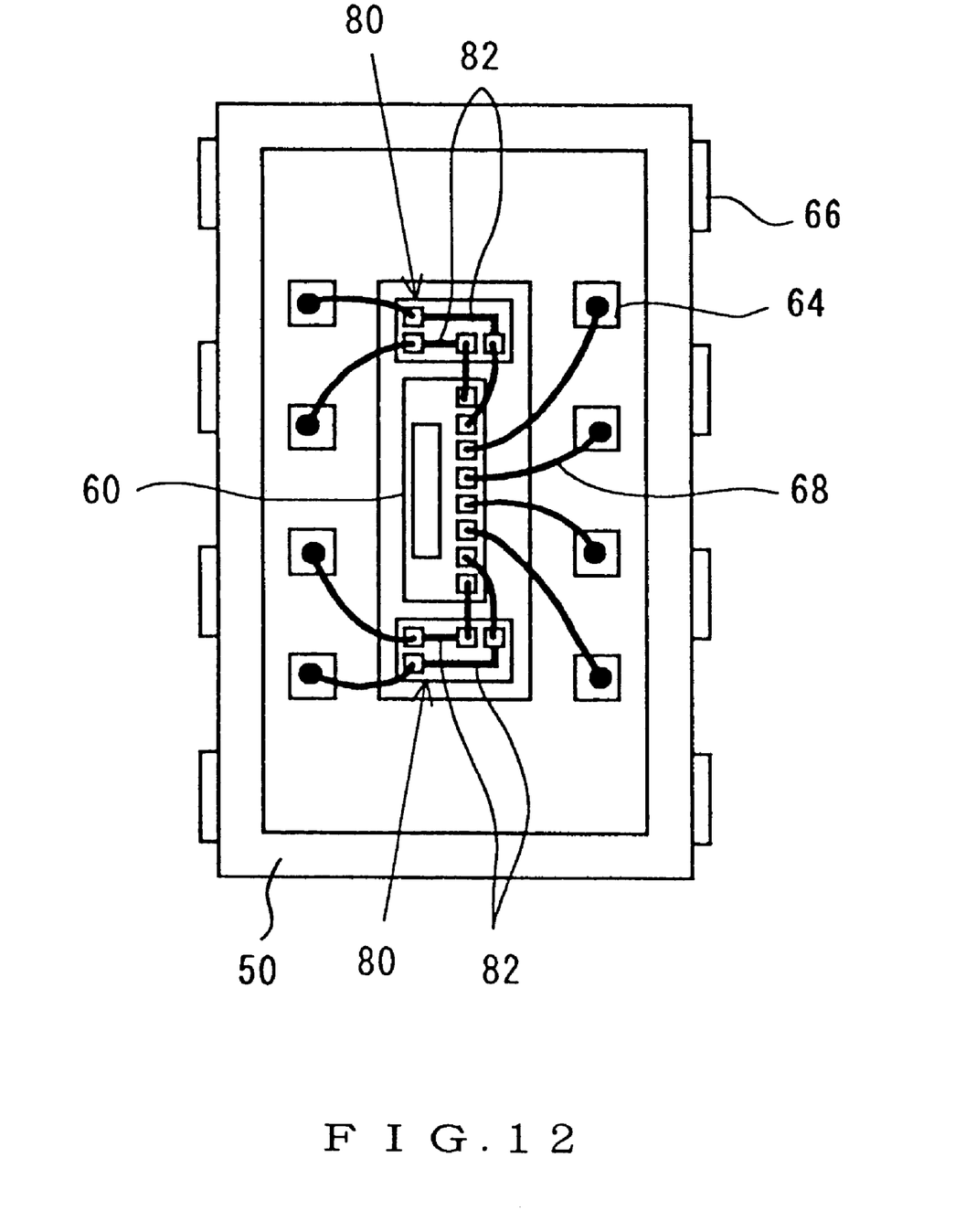
FIG. 12 is a plan view showing an example of relay wiring using a mount plate.

The sample is shown in FIG. 12. The light-receiving element array chip 60 are accommodated on the package 50, and a mount plate 80 is accommodated thereon adjacent to the chip 60. The mount plate 80 has a relay wire 82 wired into a desired pattern on the surface. A bonding pad on the chip and an edge of the relay wire is connected with a bonding wire, and the other edge of the relay wire is connected to a bonding terminal with a bonding wire. In this example, the relay wire 82 is used for connection of some of the bonding pads on the chip, but the relay wire 82 on the mount plate may be used for connection of all of the bonding pads.

It is to be noted that the present invention is not limited to the above examples, and for instance, the external leads may be provided on a rear surface (a bottom surface) of the package.

INDUSTRIAL APPLICABILITY

The light-receiving element array device according to the present invention may be arranged at a position adjacent to other optical components or an optical fiber, which contributes to size reduction of an optical device. Further, when the light-receiving element array device according to the present invention is used in an optical demultiplexer based on the Littrow type arrangement, the distance (W) from a center of a light-receiving section of the light-receiving element array device to a center of an input optical fiber and the length (L) from a main surface position of a collimator lens to the light-receiving element array device can satisfy the relation of $W/L \leq 4/50$, which make it possible to suppress coma aberration of the collimator lens and minimize the optical system without damaging the optical characteristics.

What is claimed is:

1. A light-receiving element array device in which a rectangular chip having a light-receiving section with a number of light-receiving elements arranged in the array form thereon is sealed in a rectangular package with a number of external leads and bonding terminals connected to the external leads respectively and the bonding pads on the chip and the bonding terminals on the package are connected to each other, wherein no bonding pad is provided along one longer edge of the chip and said chip is accommodated in the package at a position displaced to one side thereof so that said one longer edge of the chip gets closer to one longer edge of the package.

2. A light-receiving element array device in which a rectangular chip having a light-receiving section with a number of light-receiving elements arranged in the array form thereon is sealed in a rectangular package with a number of external leads and bonding terminals connected to the external leads respectively and the bonding pads on the chip and the bonding terminals on the package are connected to each other, wherein no bonding terminal is formed along one longer edge of said package, and said chip is accommodated in said package at a position displaced to one side of said package so that one longer edge of said chip gets closer to said longer edge of the package.

3. A light-receiving element array device in which a rectangular chip having a light-receiving section with a number of light-receiving elements arranged in the array form thereon is sealed in a rectangular package with a number of external leads and bonding terminals connected to the external leads respectively and the bonding pads on the chip and the bonding terminals on the package are connected to each other, wherein no external lead is provided along one longer edge of said package and said chip is accommodated in said package at a position displaced to one side thereof so that one longer edge of said chip gets closer to said longer edge of said package.

4. The light-receiving element array device according to claim 1, wherein no bonding terminal is provided along a longer edge of said package getting closer to said one longer edge of said chip.

5. The light-receiving element array device according to claim 1, wherein no external lead is provided along a longer edge of said package getting closer to said longer edge of said chip.

6. The light-receiving element array device according to claim 2, wherein no external lead is provided along said one longer edge of said package.

7. The light-receiving element array device according to claim 1, wherein bonding terminals and external leads are not provided along a longer edge of said package getting closer to said one longer edge of said chip.

8. The light-receiving element array device according to any of claims 1 to 7, wherein the distance between a center of a light-receiving section of said chip and a longer edge of said package is 3 mm or less.

9. The light-receiving element array device according to any of claims 1 to 7, wherein connection between the bonding pads on said chip and the corresponding bonding terminals on said package is made with a bonding wire.

10. The light-receiving element array device according to any of claims 1 to 7, wherein connection between the bonding pads on said chip and the corresponding bonding terminals on said package is made with a bonding wire and a relay wire provided in said package.

11. An optical demultiplexer comprising:

an input optical fiber;

a collimator lens for converting a diverging light flux coming out of said input optical fiber to a parallel light flux;

a diffraction grating for separating the parallel light flux coming from said collimator lens to several light components each corresponding to a wavelength; and a light-receiving element array device for converting the light fluxes for the light components separated by said diffraction grating with said collimator lens to converging light fluxes and receiving the separated converging light fluxes to detect light the light components each corresponding to a wavelength;

wherein the distance L from a main surface position of said collimator lens to a light-receiving section of said light-receiving element array device and the distance W from a center of a light-receiving section of said light-receiving element array device to a center of said input optical fiber satisfies the condition of $W/L \leq 4/50$.

12. The optical demultiplexer according to claim 11, wherein said light-receiving element array device is the one according to any of claims 1 to 7 and the light-receiving section is arranged at a position close to a mounting position for said input optical fiber.

13. An optical demultiplexer comprising:

an input optical fiber;

a collimator lens for converting a diverging light flux coming out of said input optical fiber to a parallel light flux;

a diffraction grating for separating the parallel light flux coming from said collimator lens to several light components each corresponding to a wavelength; and a light-receiving element array device for converting the light fluxes for the light components separated by said diffraction grating with said collimator lens to converging light fluxes and receiving the separated converging light fluxes to detect light the light components each corresponding to a wavelength;

wherein the distance L from a main surface position of said collimator lens to a light-receiving section of said light-receiving element array device and the distance W from a center of a light-receiving section of said light-receiving element array device to a center of said input optical fiber satisfies the condition of $W/L \leq 3/50$.

14. The optical demultiplexer according to claim 13, wherein said light-receiving element array device is the one according to any of claims 1 to 7 and the light-receiving section is arranged at a position close to a mounting section for said input optical fiber.

* * * * *

UNITED STATES PATENT AND TRADEMARK OFFICE
CERTIFICATE OF CORRECTION

PATENT NO. : 6,710,330 B1
DATED : March 23, 2004
INVENTOR(S) : Takashi Tagami and Kenichi Nakama It is certified that error appears in the above-identified patent and that said Letters Patent is hereby corrected as shown below:

Title page,
Item [57], ABSTRACT,
Line 11, "arrayed in row" should read -- arrayed in a row --.

Column 6,
Lines 13-15, "con-structions; invention employs any of the following constructions" should read -- con-structions; --.

Column 7,
Line 15, "longer edge 47 of the package 47," should read -- longer edge 47 of the Package 50, --.
Line 43, "the package, the preset invention" shoud read -- the package, the present invention --.

Signed and Sealed this

Twenty-fourth Day of August, 2004

JON W. DUDAS
*Director of the United States Patent and Trademark Office*